(12) United States Patent
Liao et al.

(10) Patent No.: US 12,209,888 B2
(45) Date of Patent: Jan. 28, 2025

(54) READING DEVICE FOR CAPACITIVE SENSING ELEMENT

(71) Applicant: INDUSTRIAL TECHNOLOGY RESEARCH INSTITUTE, Hsinchu (TW)

(72) Inventors: Lu-Pu Liao, Taoyuan (TW); Yu-Sheng Lin, Tainan (TW); Liang-Ying Liu, Zhubei (TW); Chin-Fu Kuo, Tainan (TW)

(73) Assignee: INDUSTRIAL TECHNOLOGY RESEARCH INSTITUTE, Hsinchu (TW)

( * ) Notice: Subject to any disclaimer, the term of this patent is extended or adjusted under 35 U.S.C. 154(b) by 135 days.

(21) Appl. No.: 18/097,149

(22) Filed: Jan. 13, 2023

(65) Prior Publication Data

US 2024/0133716 A1 Apr. 25, 2024
US 2024/0230379 A9 Jul. 11, 2024

(30) Foreign Application Priority Data

Oct. 19, 2022 (TW) .................................. 111139560

(51) Int. Cl.
*G01D 5/24* (2006.01)
(52) U.S. Cl.
CPC ...................................... *G01D 5/24* (2013.01)
(58) Field of Classification Search
CPC ........................................................ G01D 5/24
See application file for complete search history.

(56) References Cited

U.S. PATENT DOCUMENTS

| 6,949,937 B2 | 9/2005 | Knoedgen |
| 7,401,517 B2 | 7/2008 | Pan et al. |
| 7,456,684 B2 | 11/2008 | Fang et al. |

(Continued)

FOREIGN PATENT DOCUMENTS

| CN | 101033984 B | 1/2011 |
| TW | M363639 U | 8/2009 |
| TW | I407700 B | 9/2013 |

OTHER PUBLICATIONS

Mark Lemkin, et al., "A Three-Axis Micromachined Accelerometer with a CMOS Position-Sense Interface and Digital Offset-Trim Electronics," IEEE Journal of Solid-State Circuits, vol. 34, Issue 4, pp. 456-468 (Apr. 1999).

(Continued)

*Primary Examiner* — Alesa Allgood
(74) *Attorney, Agent, or Firm* — Maschoff Brennan (57) ABSTRACT

A reading device for capacitive sensing element comprises a differential capacitive sensing element, a modulator, a charge-voltage conversion circuit, a phase adjustment circuit, a demodulator and a low-pass filter. The modulator outputs a modulation signal to the common node of the capacitive sensing element and modulates the output signal of the capacitive sensing element. The two input terminals of the charge-to-voltage conversion circuit are connected to two non-common nodes of the capacitive sensing element. The charge-to-voltage converter read the output charge of the capacitive sensing element and convert it into a voltage signal. The modulator generates a demodulation signal through the phase adjustment circuit. The demodulator receives the demodulation signal from the phase adjustment circuit and demodulates the output of the charge-to-voltage conversion circuit. The low-pass filter is connected to the output of the demodulator for filtering the demodulated voltage signal to output the read signal.

13 Claims, 7 Drawing Sheets

(56) References Cited

U.S. PATENT DOCUMENTS

| | | |
|---|---|---|
| 7,481,111 B2 | 1/2009 | Caminada et al. |
| 7,595,648 B2 | 9/2009 | Ungaretti et al. |
| 8,354,881 B2 | 1/2013 | Denison |
| 8,375,789 B2 | 2/2013 | Prandi et al. |
| 8,800,369 B2 | 8/2014 | Caminada et al. |
| 9,410,806 B2 | 8/2016 | Ezekwe |
| 9,459,298 B2 | 10/2016 | Teterwak et al. |
| 9,615,744 B2 | 4/2017 | Denison et al. |
| 9,829,319 B2 | 11/2017 | Garbarino et al. |
| 10,747,355 B2 | 8/2020 | Krah et al. |
| 2007/0152682 A1* | 7/2007 | Ungaretti ............... G01P 15/125 324/683 |
| 2010/0000289 A1 | 1/2010 | Prandi et al. |
| 2013/0025368 A1 | 1/2013 | Donadel et al. |
| 2017/0061188 A1 | 3/2017 | Kremin et al. |
| 2018/0003504 A1 | 1/2018 | Donadel et al. |
| 2021/0108921 A1* | 4/2021 | Diazzi ................ G01C 19/5712 |

OTHER PUBLICATIONS

Jiangfeng Wu, et al., "A Low-Noise Low-Offset Capacitive Sensing Amplifier for a 50-μg/√Hz Monolithic CMOS MEMS Accelerometer," IEEE Journal of Solid-State Circuits, vol. 39, Issue 5, pp. 722-730 (May 2004).

Siew-Seong Tan, et al., "An Integrated Low-Noise Sensing Circuit With Efficient Bias Stabilization for CMOS MEMS Capacitive Accelerometers," IEEE Transactions on Circuits and Systems I: Regular Papers, vol. 58, Issue 11, pp. 2661-2672 (Nov. 2011).

Taiwan Office Action dated Oct. 18, 2023 in application No. 111139560.

\* cited by examiner

READING DEVICE FOR CAPACITIVE SENSING ELEMENT

CROSS-REFERENCE TO RELATED APPLICATIONS

This non-provisional application claims priority under 35 U.S.C. § 119(a) on Patent Application No(s). 111139560 filed in Republic of China (ROC) on Oct. 19, 2022, the entire contents of which are hereby incorporated by reference.

BACKGROUND

1. Technical Field

This disclosure relates to a reading device for capacitive sensing element and in particular, relates to a reading device for differential capacitive sensing element.

2. Related Art

With AI and 5G technology stimulating the development of industrial internet of things (IoT), the smart production line can be implemented by employing smart sensor technology. However, it is necessary for the smart sensor to be within a reasonable price and with high accuracy to meet the user's demand to be competitive in the market.

For the current differential capacitive sensor, the sensing signal is in low frequency and weak, therefore flicker noises of low frequency in the input terminal of the amplifier may be beyond the range of tolerance. Flicker noise is also referred to as "pink noise" or "1/f noise", which widely exists with intensity inversely proportional to signal frequency.

SUMMARY

According to one or more embodiment of this disclosure, a reading device for capacitive sensing element comprises a modulation signal generator, a differential capacitive sensing element comprising a common node and two non-common nodes, a charge-to-voltage conversion circuit comprising two input terminals and an output terminal, wherein the two input terminals are connected to the two non-common nodes, respectively, a phase adjustment circuit, a demodulator, and a low-pass filter. The modulation signal generator is connected to the common node of the differential capacitive sensing element and configured to output a modulation signal to the common node. The charge-to-voltage conversion circuit is configured to read a charge change of the differential capacitive sensing element and convert the charge change into a voltage signal. The phase adjustment circuit is connected to the modulation signal generator and configured to adjust a phase of the modulation signal and generate a demodulation signal. The demodulator is connected to the output terminal of the charge-to-voltage conversion circuit and the phase adjustment circuit, and configured to demodulate the voltage signal through the demodulation signal. The low-pass filter is connected to the demodulator and configured to filter the voltage signal that is demodulated and output it as a read signal.

According to one or more embodiment of this disclosure, a reading device for capacitive sensing element comprises a modulation signal generator, a differential capacitive sensing element comprising a common node and two non-common nodes, a first offset capacitor, a second offset capacitor, a charge-to-voltage conversion circuit comprising two input terminals and an output terminal, wherein the two input terminals are connected to the two non-common nodes, respectively, a phase-locked loop, a first gain circuit, a second gain circuit, a demodulator, and a low-pass filter. The modulation signal generator is connected to the common node of the differential capacitive sensing element and configured to output a modulation signal to the common node. The charge-to-voltage conversion circuit is configured to read a charge change of the differential capacitive sensing element and convert the charge change into a voltage signal. The first offset capacitor is connected to one of the two non-common nodes with one end and connected to receive a first offset signal with another end. The second offset capacitor is connected to another one of the two non-common nodes with one end and connected to receive a second offset signal with another end. The first gain circuit is connected to the charge-to-voltage conversion circuit and the phase-locked loop and configured to adjust the output of the charge-to-voltage conversion circuit to be within a readable range of the phase-locked loop. After receiving the output signal of the first gain circuit, the phase-locked loop locks its frequency and generates a demodulation signal required for the demodulation circuit. The second gain circuit is connected to the charge-to-voltage conversion circuit and the demodulator, and adjusts the output of the charge-to-voltage conversion circuit to be within a proper range and transmits it to the demodulator for signal processing. The demodulator receives the demodulation signal generated by the phase-locked loop and then demodulates the output signal of the second gain circuit. The low-pass filter is connected to the demodulator and configured to filter the voltage signal that is demodulated and output it as a read signal.

BRIEF DESCRIPTION OF THE DRAWINGS

The present disclosure will become more fully understood from the detailed description given hereinbelow and the accompanying drawings which are given by way of illustration only and thus are not limitative of the present disclosure and wherein.

DETAILED DESCRIPTION

In the following detailed description, for purposes of explanation, numerous specific details are set forth in order to provide a thorough understanding of the disclosed embodiments. According to the description, claims and the drawings disclosed in the specification, one skilled in the art may easily understand the concepts and features of the present invention. The following embodiments further illustrate various aspects of the present invention, but are not meant to limit the scope of the present invention.

Figure 1:
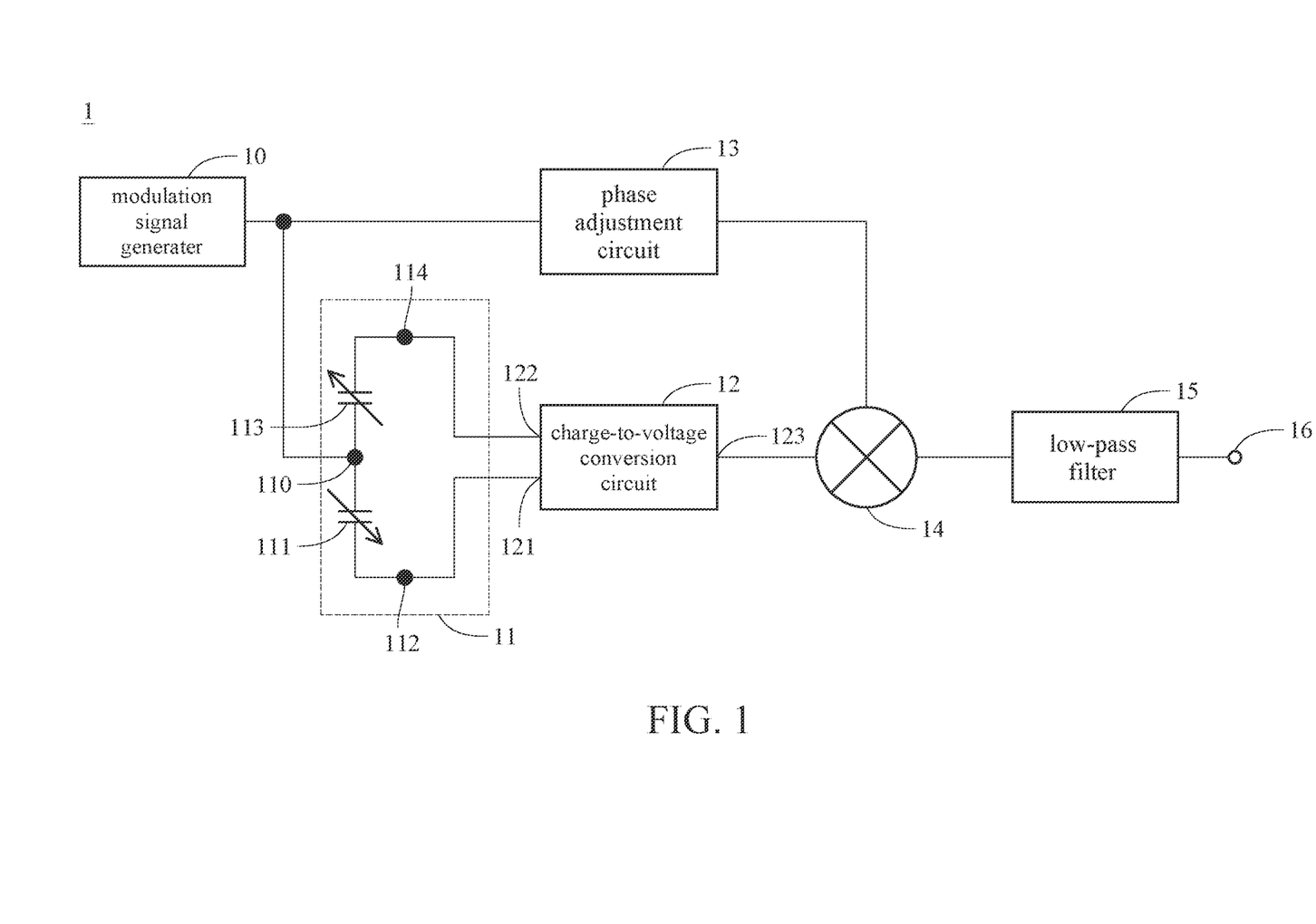
FIG. 1 is a circuit block diagram of a reading device according to an embodiment of the present disclosure.

Please refer to FIG. 1 which is a block circuit diagram of a reading device according to an embodiment of the present disclosure. As shown in FIG. 1, the reading device 1 for capacitive sensing element may include a modulation signal generator 10, a differential capacitive sensing element 11 including a common node 110 and two non-common nodes 112 and 114, a charge-to-voltage conversion circuit 12, a phase adjustment circuit 13, a demodulator 14, and a low-pass filter 15, and the reading device 1 has an output terminal 16 for outputting a read signal. The modulation signal generator 10 is connected to the common node 110 of the differential capacitive sensing element 11 and outputs a modulation signal to the common node 110. The charge-to-voltage conversion circuit 12 includes two input terminals 121 and 122 which are connected to the two non-common nodes 112 and 114, respectively, and an output terminal 123. The charge-to-voltage conversion circuit 12 is configured to read a charge change of two differential capacitors 111 and 113 inside the differential capacitive sensing element 11 and convert the charge change into a voltage signal which is output through the output terminal 123. The phase adjustment circuit 13 is connected to the modulation signal generator 10 and is configured to adjust a phase of the modulation signal and generate a demodulation signal. The demodulator 14 is connected to the output terminal 123 of the charge-to-voltage conversion circuit 12 and the phase adjustment circuit 13, and configured to demodulate the voltage signal through the demodulation signal. The low-pass filter 15 is connected to the demodulator 14 and is configured to filter the voltage signal that is demodulated, and output the filtered voltage signal as a read signal through the output terminal 16.

In FIG. 1, the reading device 1 aims at process the charge change of the differential capacitive sensing element 11 into a voltage signal form through the modulation signal generator 10, the differential capacitive sensing element 11, the charge-to-voltage conversion circuit 12, the phase adjustment circuit 13, the demodulator 14, and the low-pass filter 15, and output through the output terminal 16. The differential capacitive sensing element 11 may include two differential capacitors 111 and 113, wherein the capacitance of each of the differential capacitor 111 and the differential capacitor 113 may vary with opposite variation tendencies along with environmental factors (such as applied force or acceleration). For instance, as the capacitance of the differential capacitor 111 increases, the capacitance of the differential capacitor 113 may decrease, and vice versa. The charge-to-voltage conversion circuit 12 may read the capacitance change of the differential capacitive sensing element 11 and convert a charge signal generated by the capacitance change into a voltage signal, then output the voltage signal through the output terminal 123.

Generally speaking, the capacitance change is a signal of low frequency, and a flicker noise existed in a signal transmission process is also a low-frequency noise, which may easily have an impact on the read signal. In one embodiment, the common node 110 of the differential capacitive sensing element 11 is connected to the modulation signal generator 10 to receive a modulation signal, wherein the modulation frequency fm of the modulation signal is higher than the voltage signal frequency fs of said capacitance change, thereby modulating said voltage signal to a frequency (e.g. fm+fs) corresponding to the modulation frequency fm. Accordingly, the charge-to-voltage conversion circuit 12 may output, through the output terminal 123, the following signals: a modulated voltage signal with frequency fm+fs and a flicker noise with frequency fn, wherein fm is much greater than fn and fs, and fs is close to fn. The signal is then output to the demodulator 14 through the output terminal 123.

On the other hand, the modulation signal of the modulation signal generator 10 may be processed by the phase adjustment circuit 13 and input into the demodulator 14 as a demodulation signal, wherein the frequency of the demodulation signal may be fm, for instance. The demodulator 14 may combine the demodulation signal and the voltage signal output by the charge-to-voltage conversion circuit 12 to conduct demodulation. Specifically, the frequency of the voltage signal without the noise is fm+fs and the frequency of the demodulation signal is fm, so that the frequencies of the both signals after combining process through the demodulator 14 may be 2fm+fs and fs, respectively. In addition, the noise frequency may become fn+fm after demodulation. Therefore, the frequency of the signal generated by the demodulator 14 may include fs, fn+fm, and fs+2fm, from low to high, wherein the frequency corresponding to the voltage signal is back to fs and the frequency corresponding to the noise becomes fn+fm.

In the present embodiment, the demodulator 14 is connected to the low-pass filter so that the signal with frequency higher than certain threshold frequency may be filtered out. In one implementation, the threshold frequency of the low-pass filter 15 may be set as fm, so that the signals of high-frequencies fn+fm and 2fm+fs may be filtered out while the signal of frequency fs may be retained, that is, the voltage signal required may no longer include flicker noise with low-frequency fn.

The phase adjustment circuit 13 in the present embodiment may play a significant role in improving the quality of the demodulation signal, by adjusting the phase of the demodulation signal so that the demodulator 14 is capable of reaching a better phase-matching condition with the voltage signal. The consistent phases of the phase matching condition, especially, can prevent the signal distortion and the decline of signal-to-noise ratio (SN ratio) during the demodulation process conducted by the demodulator 14, wherein the signal distortion and the decline of the SN ratio is due to the phase difference induced by the path difference between the demodulation signal path and the signal path of the charge-to-voltage conversion circuit 12. In one implementation, the phase adjustment circuit 13 may be a resistor-capacitor circuit, a digital synthesizing circuit, or other circuit configured to adjust signal phase. In addition, the modulation signal generator 10 may be, for example, a voltage controlled oscillator (VCO), or other signal generator configured to generate signal of specific frequency. The demodulator 14 may be, for example, a mixer, a multiplier, or other signal mixer configured to combine multiple input signal.

Figure 2:
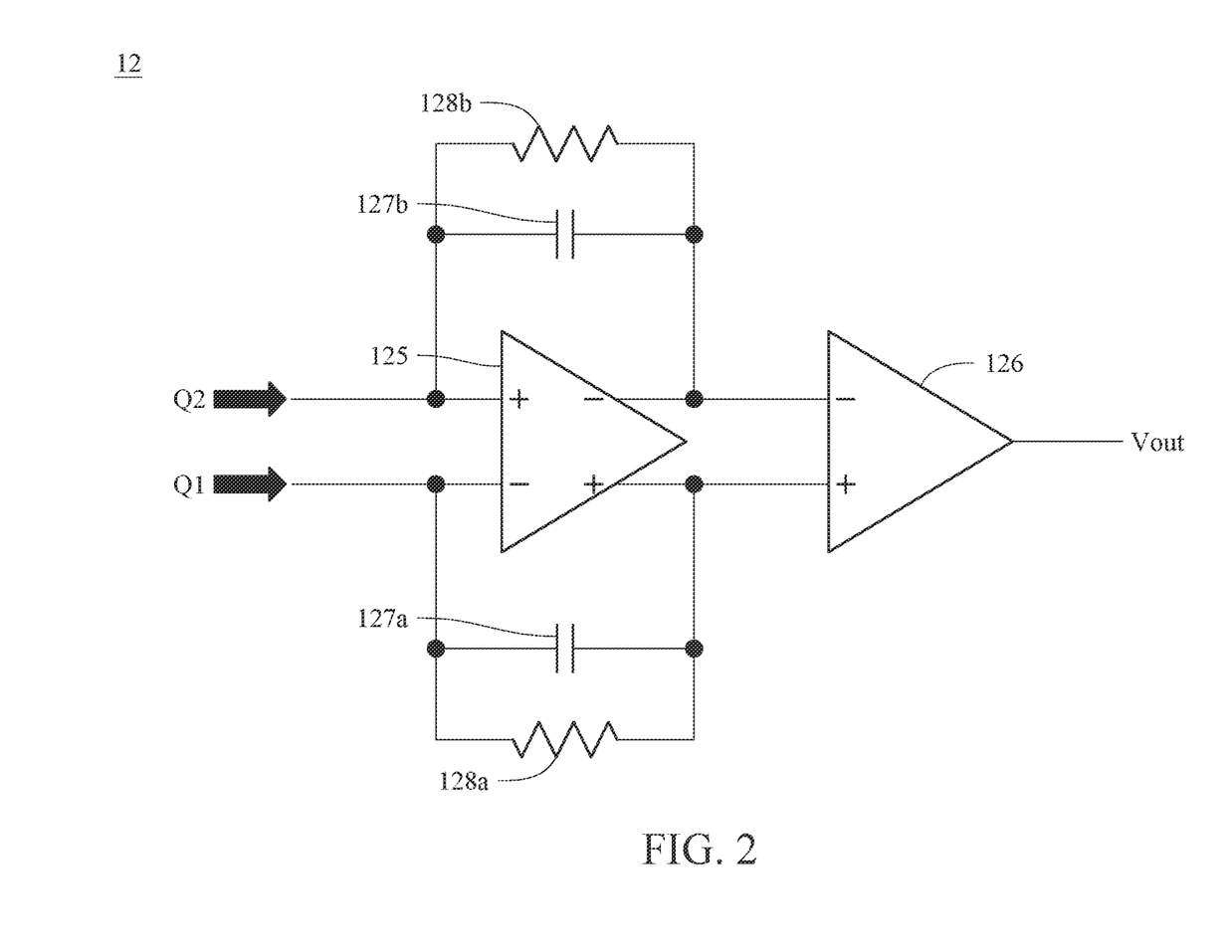
FIG. 2 illustrates one implementation of the charge-to-voltage conversion circuit according to an embodiment of the present disclosure.

FIG. 2 and FIG. 3 can be referred for further detailed descriptions of the charge-to-voltage conversion circuit 12 of the embodiment shown in FIG. 1. Please refer to FIG. 2 which illustrates one implementation of the charge-to-voltage conversion circuit according to an embodiment of the present disclosure. The charge-to-voltage conversion circuit 12 may include a first amplifier 125 and a second amplifier 126 inside. The first amplifier 125 is configured to receive a charge signal Q1 corresponding to the signal from the input terminal 122 shown in FIG. 1, and receive another charge signal Q2 corresponding to the signal from the input terminal 122. The first amplifier 125 also outputs two voltage signals to the second amplifier 126 according to the two charge signals, so that the second amplifier 126 generates a voltage output Vout according to a voltage difference between the two voltage signals. In addition, the charge-to-voltage conversion circuit 12 may further include a pair of capacitors 127*a*, 127*b* and a pair of resistors 128*a*, 128*b*. The capacitor 127*a* and the resistor 128*a* may be connected between another input terminal and another output terminal of the first amplifier 125 in parallel. Further referring to FIG. 1 and FIG. 2 together, the charge-to-voltage conversion circuit 12 may receive the charge signal Q1 with the input terminal 121, receive the charge signal Q2 with another input terminal 122, and generate the output voltage Vout at the output terminal 123.

Figure 3:
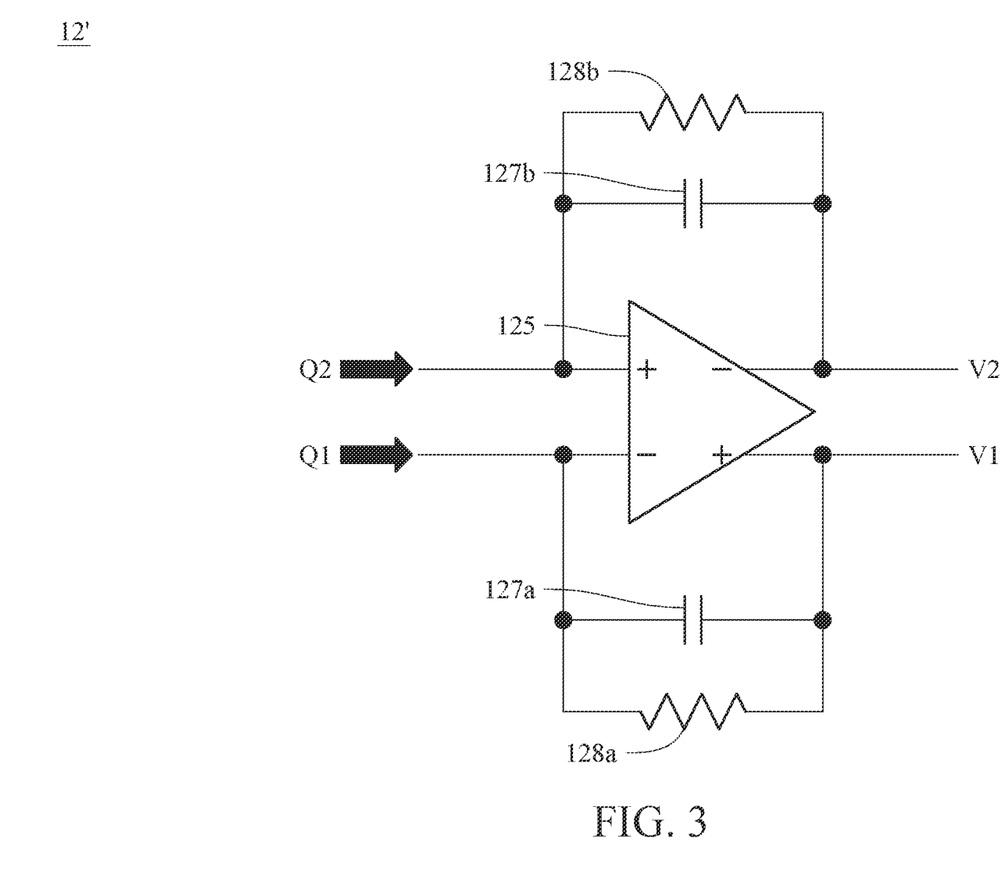
FIG. 3 illustrates another implementation of the charge-to-voltage conversion circuit according to an embodiment of the present disclosure.

Please refer to FIG. 3 which illustrates another implementation of the charge-to-voltage conversion circuit according to an embodiment of the present disclosure. The charge-to-voltage conversion circuit 12' may include an amplifier 125 which is configured to receive a charge signal Q1 (the signal from the input terminal 121 shown in FIG. 1) and another charge signal Q2 (the signal from the input terminal 122 shown in FIG. 1), and output two voltages V1 and V2 according to the two charge signals, so that the following circuit may generate a voltage signal based on the voltage difference between two voltages V1 and V2. In other words, the output signal of the charge-to-voltage conversion circuit 12' may be a differential signal. In addition, the charge-to-voltage conversion circuit 12' may further include a pair of capacitors 127*a*, 127*b* and a pair of resistors 128*a*, 128*b*. The capacitor 127*a* and the resistor 128*a* may be connected between an input terminal and an output terminal of the amplifier 125 in parallel. The capacitor 127*b* and the resistor 128*b* may be connected between another input terminal and another output terminal of the amplifier 125 in parallel. Further referring to FIG. 1 and FIG. 3 together, the charge-to-voltage conversion circuit 12 in FIG. 1 may be substituted with the charge-to-voltage conversion circuit 12' in FIG. 3, wherein the charge-to-voltage conversion circuit 12' may receive the charge signal Q1 through the input terminal 121, the charge signal Q2 through another input terminal 122, output the voltages V1 and V2 through the two output wires, and generate a voltage signal defined as a difference between two output voltages (Vout=V1-V2), namely, a differential signal. It should be noted that, connection wires carrying two voltages V1 and V2 may be regarded as carrying the voltage signal mentioned above, and the two output voltages may be transmitted through subsequent elements. For example, the demodulator 14 and the low-pass filter 15 may similarly include two output wires, and the voltage difference between two output terminals of the low-pass filter 15 may be the read signal, namely, a differential signal. Therefore, the present disclosure is not limited to the illustrative embodiments.

Figure 4:
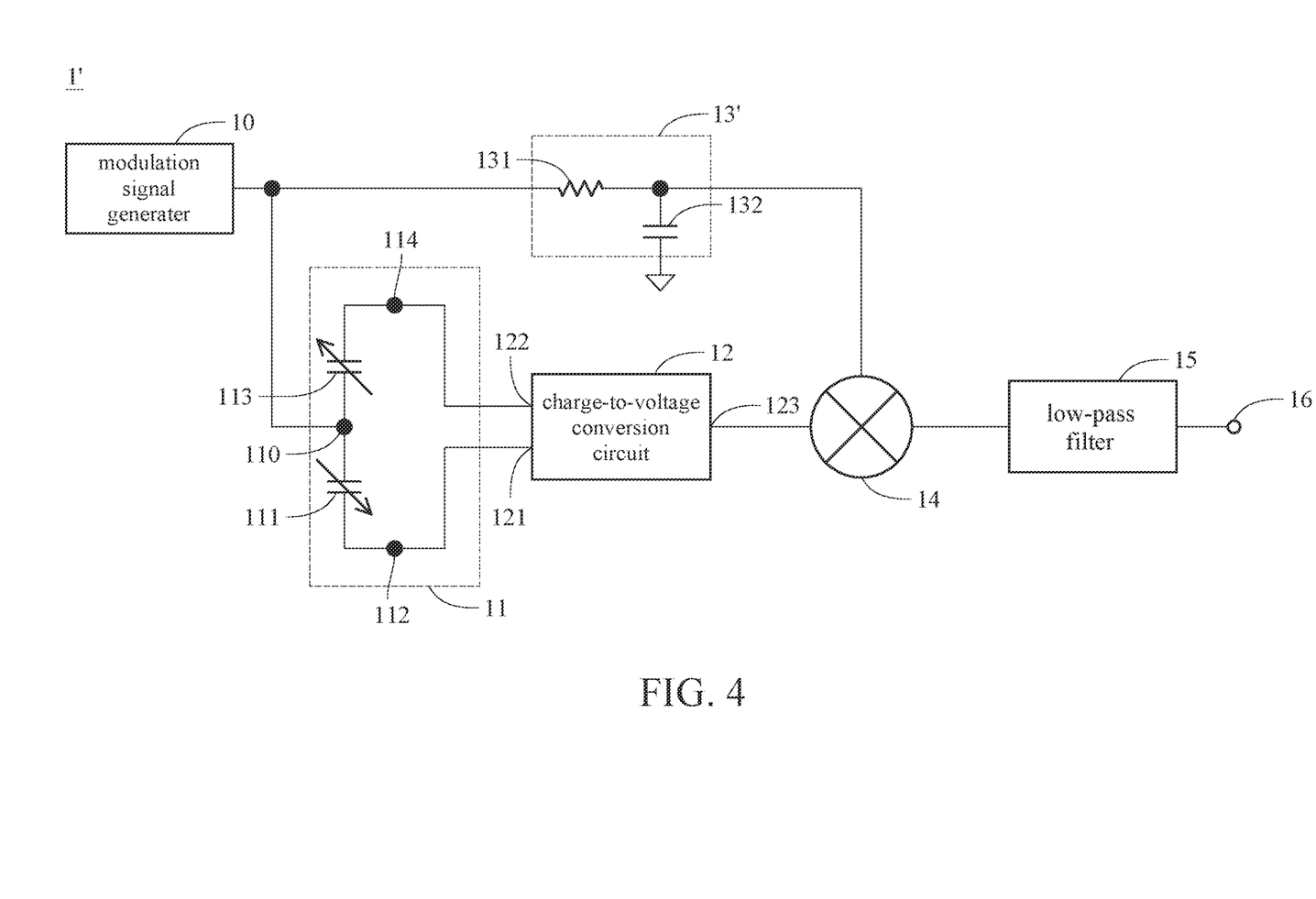
FIG. 4 is a circuit block diagram of one implementation of the reading device according to an embodiment of the present disclosure shown in FIG. 1.

Please refer to FIG. 4 which is a block circuit diagram of one implementation of the reading device according to an embodiment of the present disclosure shown in FIG. 1. The reading device 1' in the present implementation includes the same elements and connections therebetween in the embodiment shown in FIG. 1, including the modulation signal generator 10, the differential capacitive sensing element 11, the charge-to-voltage conversion circuit 12, a phase adjustment circuit 13', the demodulator 14, and the low-pass filter 15, and outputting through the output terminal 16. The differential capacitive sensing element 11 includes a common node 110 and two non-common nodes 112 and 114. The charge-to-voltage conversion circuit 12 includes two input terminals 121 and 122 and an output terminal 123. In addition, the phase adjustment circuit 13' of the present implementation is implemented by an RC circuit, which is the part further depicted in the following while the description of the rest of the elements or circuits with operations same as the embodiment shown in FIG. 1 are omitted.

In the present implementation, the phase adjustment circuit 13' includes the resistor 131 and the capacitor 132, wherein the resistor 131 is connected to the modulation signal generator 10 and the demodulator 14, and the capacitor 132 is connected to the resistor 131 and the demodulator 14 with one end and grounded with another end. When the modulation signal generated by the modulation signal generator 10 passes through the phase adjustment circuit 13', the circuit containing the resistor 131 and the capacitor 132 may delay the phase of the modulation signal, thereby inputting the delayed modulation signal into the demodulator 14 as a demodulation signal, so that the demodulation signal in the demodulator 14 can reach a good phase-matching condition with the voltage signal.

Figure 5:
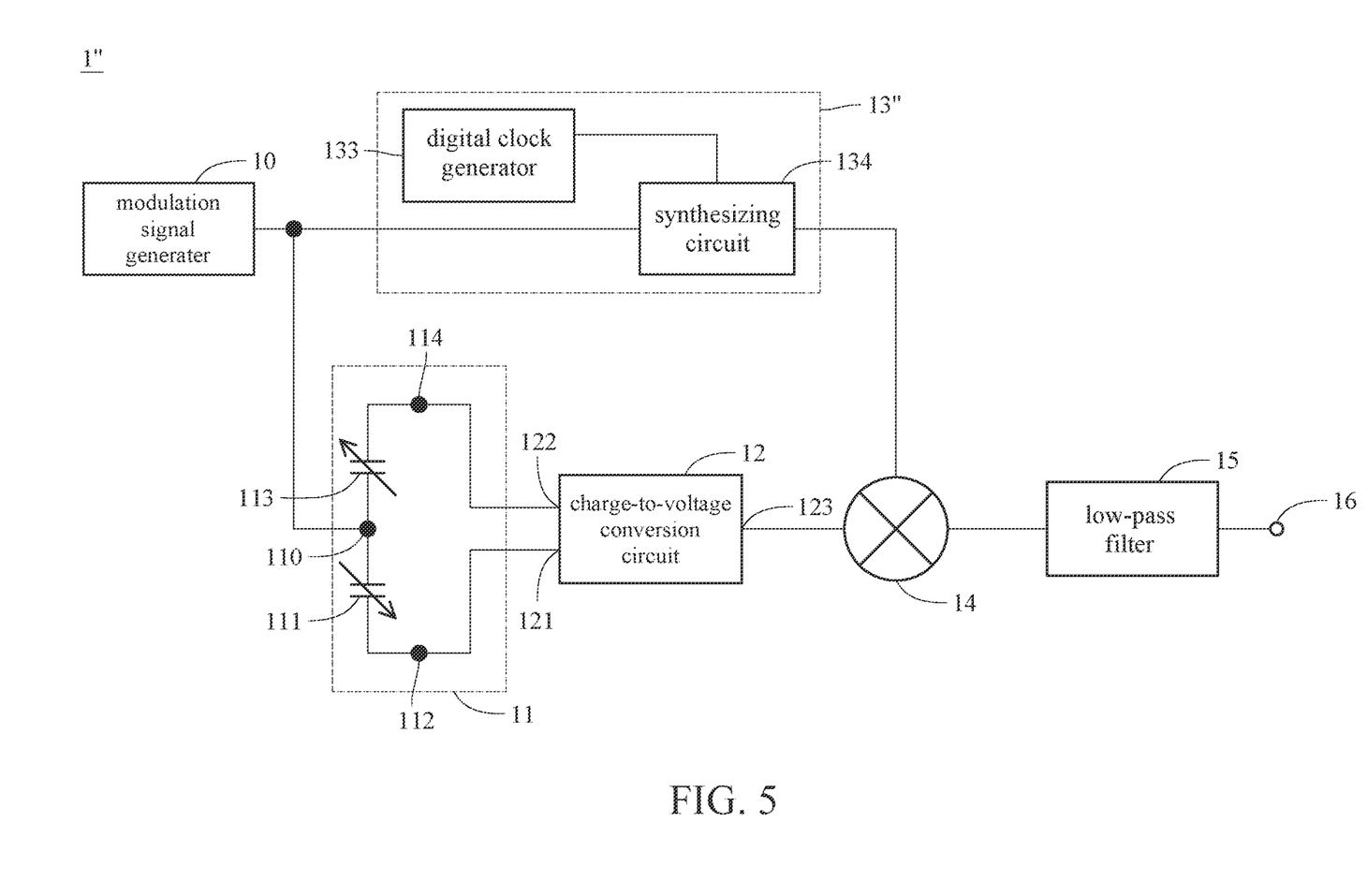
FIG. 5 is a circuit block diagram of another implementation of the reading device according to an embodiment of the present disclosure shown in FIG. 1.

Please refer to FIG. 5, which is a block circuit diagram of another implementation of the reading device according to an embodiment of the present disclosure shown in FIG. 1. The reading device 1" of the present embodiment includes the same elements and connections therebetween in the embodiment shown in FIG. 1, including the modulation signal generator 10, the differential capacitive sensing element 11, the charge-to-voltage conversion circuit 12, a phase adjustment circuit 13", the demodulator 14, and the low-pass filter 15, and outputting through the output terminal 16. The differential capacitive sensing element 11 includes the common node 110 and two non-common nodes 112 and 114. The charge-to-voltage conversion circuit 12 includes two input terminals 121 and 122 and an output terminal 123. In addition, the phase adjustment circuit 13" of the present implementation is implemented by a digital synthesizing circuit, which is the part further depicted in the following while description of the rest of the elements or circuits with operations same as the embodiment shown in FIG. 1 are omitted.

In the present implementation, the phase adjustment circuit 13" uses a digital synthesis scheme including being connected to a digital clock generator 133 and a synthesizing circuit 134. The digital clock generator 133 is connected to the synthesizing circuit 134 and configured to generate a digital clock signal and input the digital clock signal into the synthesizing circuit 134. The synthesizing circuit 134 is connected to the modulation signal generator 10 and the demodulator 14, and configured to synthesize the digital clock signal and the modulation signal and generate a demodulation signal with specific phase, so that the demodulation signal in the demodulator 14 can reach a good phase-matching condition with the voltage signal. For example, the synthesizing circuit 134 may be a counter. In addition, the charge-to-voltage conversion circuit 12 of the embodiment shown in FIG. 4 and FIG. 5 may be implemented by the charge-to-voltage conversion circuit 12 with single-terminal shown in FIG. 2, or may be substituted with the differential charge-to-voltage conversion circuit 12' shown in FIG. 3. Specifically, two output terminals of the differential charge-to-voltage conversion circuit 12' are connected to the demodulator 14, and the demodulator 14 may be connected to the low-pass filter 15 through two output wires. The low-pass filter 15 has two output terminals where a voltage difference therebetween is served as a read signal.

Figure 6:
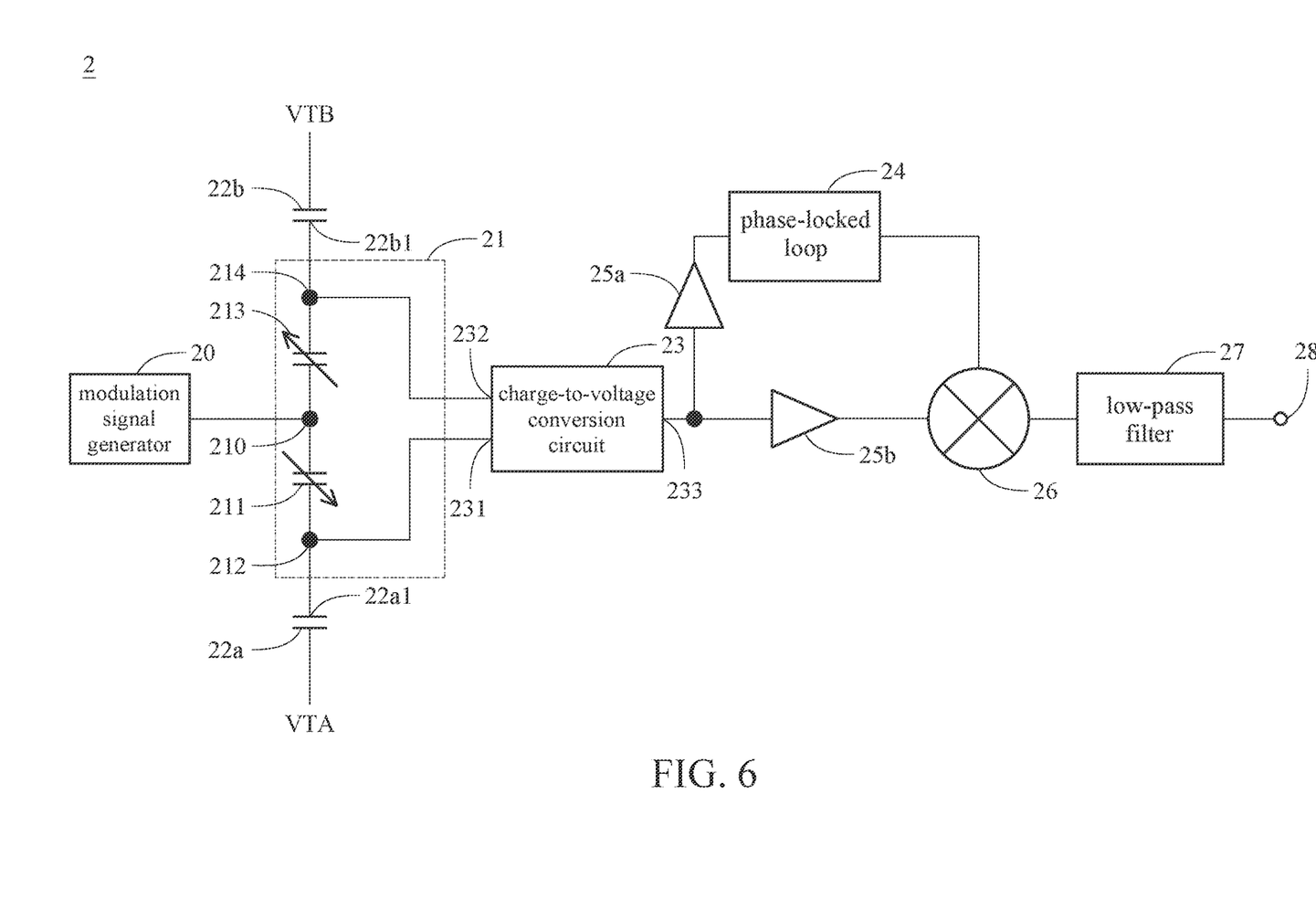
FIG. 6 is a circuit block diagram of a reading device according to another embodiment of the present disclosure.

Please refer to FIG. 6 which is a block circuit diagram of a reading device according to another embodiment of the present disclosure. The reading device 2 of the present embodiment includes a signal generator 20, a differential capacitive sensing element 21 with a common node 210 and two non-common nodes 212 and 214, a first offset capacitor 22a, a second offset capacitor 22b, a charge-to-voltage converter 23, a phase-locked loop 24, a first gain circuit 25a, a second gain circuit 25b, a demodulator 26, and a low-pass filter 27, and has an output terminal 28 for outputting a read signal. The modulation signal generator 20 is connected to the common node 210 of the differential capacitive sensing element 21 and input a modulation signal into the common node 210. The first offset capacitor 22a is connected to the non-common node 212 with one end, and receives a first offset signal VTA with another end. The second offset capacitor 22b is connected to the non-common node 214 with one end, and receives a second offset signal VTB with another end. The charge-to-voltage converter 23 includes two input terminals 231 and 232 connected to the two non-common nodes 212 and 214 respectively, and an output terminal 233. The charge-to-voltage converter 23 is configured to read a capacitance change between the two differential capacitors 211 and 213 and convert the capacitance change into a voltage signal. The first gain circuit 25a adjusts the output of the charge-to-voltage converter 23 to a proper level and inputs the adjusted output into the phase-locked loop 24. After receiving the output of the first gain circuit 25a, the phase-locked loop 24 locks the oscillation frequency of it and generates and transmits a demodulation signal to the demodulator for demodulation. The demodulator 26 may be connected to the output terminal 233 of the charge-to-voltage converter 23 and the phase-licked loop 24 through the second gain circuit 25b, and configured to demodulate the voltage signal through the demodulation signal. The low-pass filter 27 is connected to the demodulator 26 and configured to filter the demodulated voltage signal to output a read signal. It should be noted that, the first gain circuit 25a and the second gain circuit 25b are selectively disposed in the reading device 2.

In the present embodiment, the first and second offset capacitors 22a and 22b and the phase-locked loop 24 may retrieve information of the modulation signal generated by the modulation signal generator 20 from the voltage signal output from the charge-to-voltage converter 23, and transmit the demodulation signal which is in a phase matching condition with the voltage signal generated through phase-locking to the demodulator 26. In one implementation, the phase-locked loop 24 of the present embodiment may make the signal lowest point of the modulated voltage signal at least be higher than a voltage sensing threshold of the phase-locked loop 24 through the first and the second offset signals VTA and VTB which are respectively applied to another end of the first offset capacitor 22a and another end of the second offset capacitor 22b. It is to say that, the phase-locked loop 24 may automatically detect the carrier frequency of the voltage signal in a precise way, and the reading device 2 achieve an automatic calibration function.

Specifically, assuming the modulation signal output by the modulation signal generator 20 being Vm, and the capacitance difference between two differential capacitors 211 and 213 being $\Delta C$, the differential signal (Q1-Q2) without offset capacitor is Vm×$\Delta C$ according to the relation of the quantity of electric charge=capacitance×voltage (Q=C×V). Therefore, when the difference of the capacitance is too small (and so is the differential signal), it is difficult for the subsequent phase-locked loop 24 to capture the frequency fm of the modulation signal. In the present embodiment, the intensity of the differential signal of the differential capacitive sensing element 21 may be effectively adjusted through respectively disposing the first and second offset capacitors 22a and 22b at the two non-common nodes, and respectively applying two offset signals VTA and VTB to another end of the first offset capacitor 22a and another end of the second offset capacitor 22b, so that the differential signal can reach a signal intensity threshold that is extractable by the phase-locked loop 24. In one implementation, assuming that the first offset capacitor 22a has the capacitance C1 and the second offset capacitor 22b has the capacitance C2 and the first offset capacitor 22a and the second offset capacitor 22b are applied with two offset signals VTA and VTB, respectively, then the differential signal (Q1-Q2) is Vm×$\Delta C$±(VTA×C22a−VTB×C22b), which is based on the voltage signal intensity corresponding to the differential signal being higher than the signal intensity threshold of the phase-locked loop 24. $\Delta C$ is an initial capacitance difference between capacitance of the differential sensing capacitor 211 and capacitance of the differential sensing capacitor 213, C22a is capacitance of the first offset capacitor 22a, and C22b is capacitance of the second offset capacitor 22b. Values of VTA, VTB, C22a, and C22b mentioned above may be designed according to requirements and are not limited herein.

Figure 7:
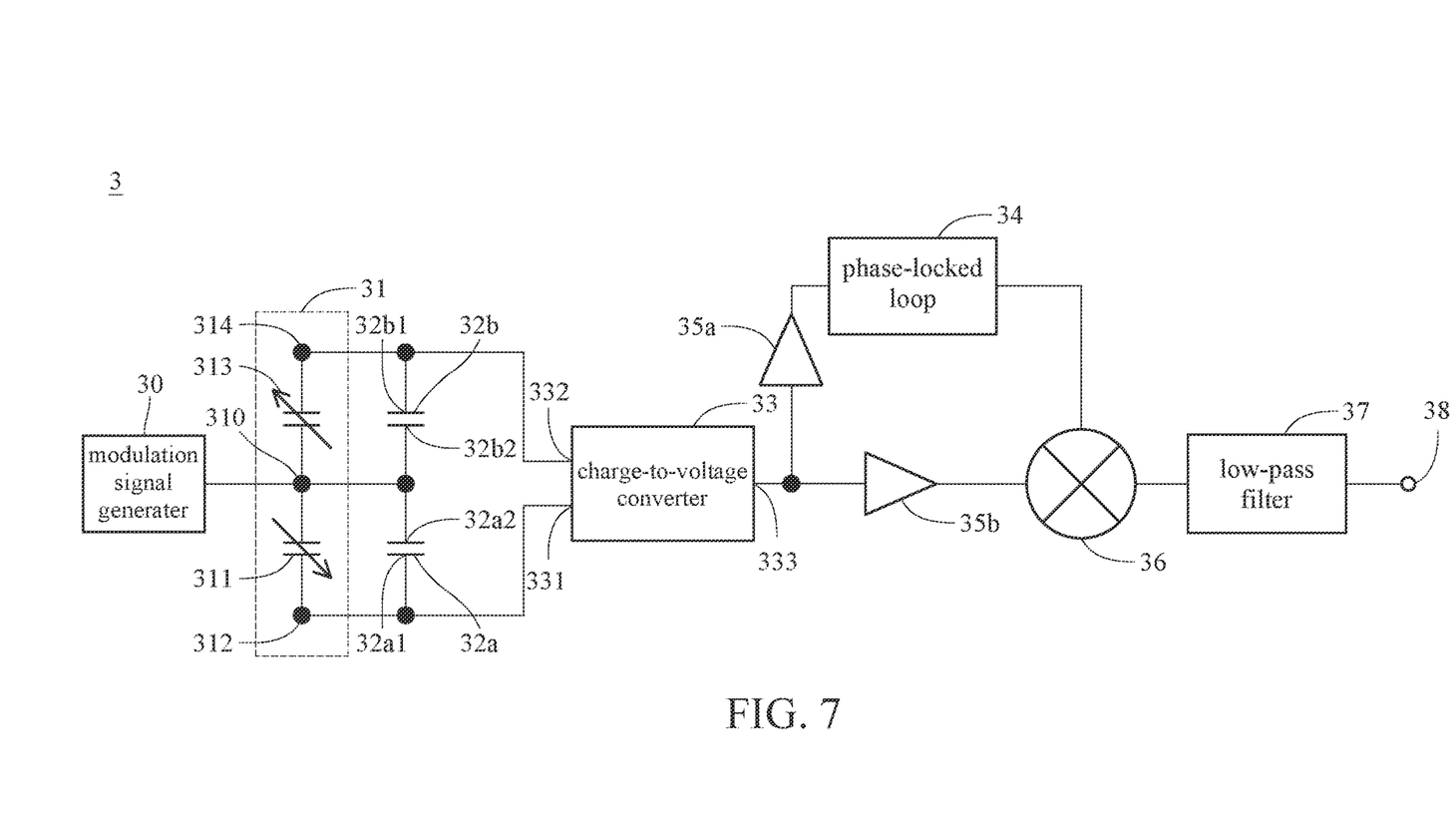
FIG. 7 is a block circuit diagram of a reading device according to yet another embodiment of the present disclosure.

Please refer to FIG. 7, which is a block circuit diagram of a reading device according to further embodiment of the present disclosure. The reading device 3 includes a modulation signal generator 30, a differential capacitive sensing element 31, a first offset capacitor 32a, a second offset capacitor 32b, a charge-to-voltage converter 33, a phase-locked loop 34, a demodulator 36, and a low-pass filter 37, and an output terminal 38. The differential capacitive sensing element 31 includes a common node 310, two non-common nodes 312 and 314, and two differential capacitors 311 and 313. In addition, the reading device 3 may further selectively include a first gain circuit 35a connected to the charge-to-voltage converter 33 and the phase-locked loop 34, and a second gain circuit 35b connected to the charge-to-voltage converter 33 and the demodulator 36. The elements and connections therebetween of the present embodiment are basically same as that of the embodiment shown in FIG. 4 (including one end 32a1 of the first offset capacitor 32a and one end 32b1 of the second offset capacitor 32b connected to two non-common nodes 312 and 314, respectively), except for another end 32a2 of the first offset capacitor 32a and another end 32b2 of the second offset capacitor 32b connected to the common node 310.

As mentioned above, the differential signal (Q1-Q2) without offset capacitor is Vm×$\Delta C$. In the present embodiment, the configuration of the first offset capacitor 32a may be regard as connected to the differential capacitor 311 in parallel, and the second offset capacitor 32b connected to the differential capacitor 313 in parallel, with well-known fact that two capacitors connected in parallel is equivalent to an effective capacitor with summed capacitance (C=C1+C2). In the present embodiment, $\Delta C$ may be constantly greater than a certain value so that the differential signal may at least overcome the signal intensity threshold of the phase-locked loop 34 by selecting the first offset capacitor 32a and the second offset capacitor 32b under some requirements, to make the phase-locked loop 34 capable of capturing the modulation signal Vm.

In addition, the charge-to-voltage converters 23 and 33 with single-terminal shown in FIG. 6 and FIG. 7 may be implemented by the charge-to-voltage converter 12 shown in FIG. 2, or be selectively substituted with the charge-to-voltage converter 12' shown in FIG. 3. Specifically, the two terminals of the charge-to-voltage converter 12' may be connected to the demodulator 26 or 36 through the second gain circuit 25b or 35b. The demodulator 26 or 36 may be connected to the low-pass filter 27 or 37 through two output wires. The low-pass filter 27 or 37 has two output terminals where the voltage difference therebetween is served as a read signal, that is, a differential signal.

Accordingly, the reading device 3 of the present embodiment may make the lowest point of the modulated voltage signal to be at least higher than a voltage sensing threshold of the phase-locked loop 34 to ensure that the phase-locked loop 34 can detect the voltage signal frequency. Therefore, the frequency of the voltage signal can be detected in a precise way.

In view of the above description, the reading device for capacitive sensing element can input a modulation signal into a common node of the differential capacitive sensing element to modulate the sensing signal which is probably mixed with some noise to a higher frequency band. Next, the reading device may demodulate the modulated sensing signal to the original frequency band by specific demodulation signal which is in a phase matching condition with the modulated sensing signal and is generated by demodulation signal generation circuit. The low-pass filter is also applied to filter out noise, thereby maximizing quantity of signal and effectively improving the signal-to-noise ratio.

Although the present invention is disclosed in the foregoing embodiments, it is not intended to limit the present invention. Changes and modifications made without departing from the spirit and scope of the present invention belong to the scope of patent protection of the present invention. For the scope defined by the present invention, please refer to the attached claims.

What is claimed is:

1. A touch feedback device, comprising:
   a differential capacitive sensing element comprising a common node and two non-common nodes;
   a charge-to-voltage conversion circuit comprising two input terminals and an output terminal, wherein the two input terminals are connected to the two non-common nodes, respectively, and the charge-to-voltage conversion circuit is configured to read a charge change of the differential capacitive sensing element and convert the charge change into a voltage signal;
   a modulation signal generator, connected to the common node of the differential capacitive sensing element, and configured to output a modulation signal to the common node;
   a demodulator connected to the output terminal of the charge-to-voltage conversion circuit,
   a low-pass filter connected to the demodulator and configured to filter the voltage signal; and
   a phase adjustment circuit, connected to the common node of the differential capacitive sensing element and the output terminal of the charge-to-voltage conversion circuit, configured to adjust a phase of the modulation signal in response to a characteristic time delay inherent to the phase adjustment circuit, wherein the demodulator is configured to demodulate a combined signal comprising the adjusted modulation signal and the voltage signal.

2. The touch feedback device of claim 1, wherein the phase adjustment circuit comprises:
   a resistor connected to the modulation signal generator; and
   a capacitor with one end connected to the resistor and the demodulator, and with another end grounded.

3. The touch feedback device of claim 1, wherein the charge-to-voltage conversion circuit is a differential charge-to-voltage conversion circuit.

4. The touch feedback device of claim 1, wherein the voltage signal is a differential signal.

5. The touch feedback device of claim 1, wherein the phase adjustment circuit comprises:
   a synthesizing circuit connected to the modulation signal generator and the demodulator, and configured to synthesize a digital clock signal and the modulation signal to input to the demodulator; and
   a digital clock generator connected to the synthesizing circuit, and configured to generate the digital clock signal.

6. The touch feedback device of claim 5, wherein the synthesizing circuit is a counter.

7. A reading device for capacitive sensing element, comprising:
   a differential capacitive sensing element comprising a common node and two non-common nodes;
   a charge-to-voltage conversion circuit comprising two input terminals and an output terminal, wherein the two input terminals are connected to the two non-common nodes, respectively, and the charge-to-voltage conversion circuit is configured to read a charge change of the differential capacitive sensing element and convert the charge change into a voltage signal;
   a modulation signal generator, connected to the common node of the differential capacitive sensing element, configured to output a modulation signal to the common node;
   a first offset capacitor with one end connected to one of the two non-common nodes;
   a second offset capacitor with one end connected to another one of the two non-common nodes;
   a demodulator connected to the output terminal of the charge-to-voltage conversion circuit and the phase-locked loop;
   a low-pass filter connected to the demodulator;
   a phase-locked loop, connected to the output terminal of the charge-to-voltage conversion circuit and the demodulator, configured to lock a phase of the modulation signal in response to a characteristic time delay inherent to the phase-locked loop, wherein the demodulator is configured to demodulate a combined signal comprising the locked modulation signal and the voltage signal.

8. The reading device for capacitive sensing element of claim 7, wherein another end of the first offset capacitor is configured to receive a first offset signal, and another end of the second offset capacitor is configured to receive a second offset signal.

9. The reading device for capacitive sensing element of claim 7, wherein another end of the first offset capacitor is connected to the common node, and another end of the second offset capacitor is connected to the common node.

10. The reading device for capacitive sensing element of claim 7, wherein the charge-to-voltage conversion circuit is a differential charge-to-voltage conversion circuit.

11. The reading device for capacitive sensing element of claim 7, wherein the voltage signal is a differential signal.

12. The reading device for capacitive sensing element of claim 7, further comprising a first gain circuit connected to the charge-to-voltage conversion circuit and the phase-locked loop, and configured to amplify the voltage signal output by the charge-to-voltage conversion circuit and output the voltage signal that is amplified to the phase-locked loop.

13. The reading device for capacitive sensing element of claim 12, further comprising a second gain circuit connected to the charge-to-voltage conversion circuit and the demodulator, and configured to amplify the voltage signal output by the charge-to-voltage conversion circuit and output the voltage signal that is amplified to the demodulator.

* * * * *